(12) United States Patent
Ogata et al.

(10) Patent No.: US 7,777,206 B2
(45) Date of Patent: Aug. 17, 2010

(54) ION IMPLANTATION DEVICE CONTROL METHOD, CONTROL SYSTEM THEREOF, CONTROL PROGRAM THEREOF, AND ION IMPLANTATION DEVICE

(75) Inventors: Seiji Ogata, Chigasaki (JP); Hidekazu Yokoo, Susono (JP); Masasumi Araki, Chigasaki (JP)

(73) Assignee: ULVAC, Inc., Chigasaki-shi (JP)

( * ) Notice: Subject to any disclaimer, the term of this patent is extended or adjusted under 35 U.S.C. 154(b) by 379 days.

(21) Appl. No.: 11/813,937

(22) Filed: Jul. 13, 2007

(65) Prior Publication Data

US 2009/0189066 A1     Jul. 30, 2009

(30) Foreign Application Priority Data

Feb. 24, 2005   (JP)   ............................. 2005-048584

(51) Int. Cl.
  *A61N 5/00*  (2006.01)
(52) U.S. Cl. .................................. 250/492.3; 250/492.1
(58) Field of Classification Search ........................ None
  See application file for complete search history.

(56) References Cited

U.S. PATENT DOCUMENTS

| 5,132,545 | A | * | 7/1992 | Shono et al. ............. 250/492.2 |
| 5,438,203 | A | * | 8/1995 | Glavish et al. ......... 250/396 ML |
| 5,481,116 | A | * | 1/1996 | Glavish et al. ......... 250/396 ML |
| 5,672,879 | A | * | 9/1997 | Glavish ............... 250/396 ML |
| 5,757,009 | A | * | 5/1998 | Walstrom ............... 250/396 R |
| 5,947,053 | A | * | 9/1999 | Burnham et al. ............ 116/208 |
| 6,218,676 | B1 | * | 4/2001 | Nakasuji .................. 250/492.3 |
| 6,242,747 | B1 | | 6/2001 | Sugitanu et al. |
| 6,326,633 | B2 | * | 12/2001 | Nakasuji .................. 250/492.3 |
| 6,621,090 | B2 | * | 9/2003 | Simizu .................... 250/492.2 |
| 6,763,316 | B2 | * | 7/2004 | Evans ........................ 702/134 |
| 7,064,340 | B1 | * | 6/2006 | Vanderberg et al. ..... 250/492.21 |
| 2001/0008274 | A1 | * | 7/2001 | Nakasuji .................. 250/492.3 |

(Continued)

FOREIGN PATENT DOCUMENTS

GB        2284092        5/1995

(Continued)

OTHER PUBLICATIONS

International Search Report from related application dated May 23, 2006 (1 pg).

*Primary Examiner*—Bernard E Souw
*Assistant Examiner*—Andrew Smyth
(74) *Attorney, Agent, or Firm*—Grossman, Tucker, Perreault & Pfleger, PLLC (57) ABSTRACT

A control method of an ion implantation device that radiates an ion beam emitted from an ion source via an optical element onto a material to be treated, includes the steps of: measuring the spatial distribution of the ion beam in the vicinity of the material to be treated; estimating the emittance, which is the spatial and angular distribution of the ion beam of the ion source, from the measured spatial distribution, by using an ion beam trajectory calculation method; calculating the operating conditions of the optical element so that the ion beam in the vicinity of the material to be treated has a desired spatial distribution, by using the estimated emittance and the trajectory calculation method; and operating the ion implantation device by using the calculated operating conditions of the optical element.

4 Claims, 6 Drawing Sheets

U.S. PATENT DOCUMENTS

| | | | |
|---|---|---|---|
| 2002/0008209 A1* | 1/2002 | Simizu | 250/427 |
| 2003/0122085 A1* | 7/2003 | Stengl et al. | 250/423 F |
| 2003/0191899 A1* | 10/2003 | Evans | 711/134 |
| 2004/0149926 A1* | 8/2004 | Purser et al. | 250/397 |
| 2006/0097193 A1* | 5/2006 | Horsky et al. | 250/492.21 |
| 2006/0124867 A1* | 6/2006 | Vanderberg et al. | 250/492.21 |

FOREIGN PATENT DOCUMENTS

| | | |
|---|---|---|
| JP | 63091949 | 4/1988 |
| JP | 643950 | 1/1989 |
| JP | 05135729 | 1/1993 |

* cited by examiner

ION IMPLANTATION DEVICE CONTROL METHOD, CONTROL SYSTEM THEREOF, CONTROL PROGRAM THEREOF, AND ION IMPLANTATION DEVICE

TECHNICAL FIELD

The present invention relates to an ion implantation device control method, a control system thereof, a control program thereof, and an ion implantation device.

Priority is claimed on Japanese Patent Application No. 2005-048584, filed Feb. 24, 2005, the content of which is incorporated herein by reference.

BACKGROUND ART

In semiconductor processing, ion implantation processing of semiconductor substrates is necessary. In the processing, an ion beam emitted from an ion source is accelerated or decelerated to a predetermined energy by an accelerating tube, and converged by quadrupole lenses to irradiate the substrate. In order to implant the ions in the substrate uniformly, the ion beam is scanned while the irradiation is performed.

Figure 8A:
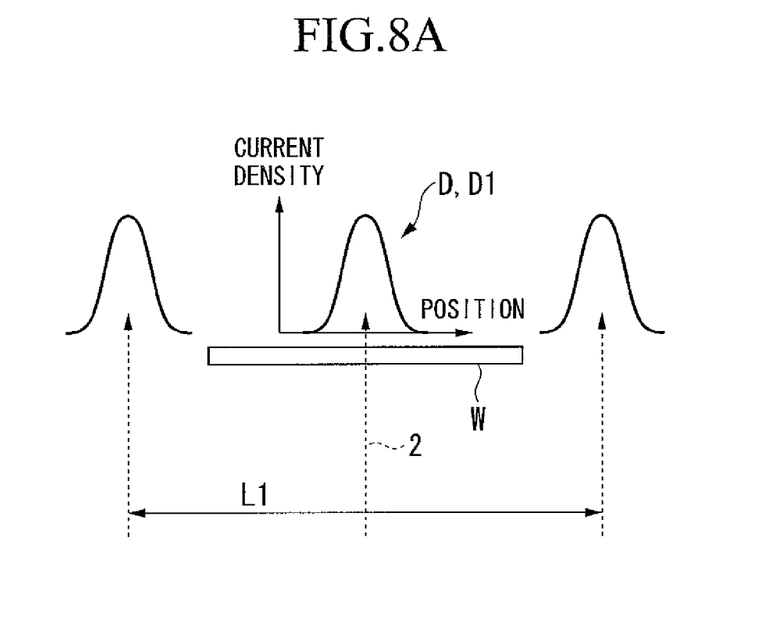
FIG. 8A is an explanatory diagram of the spatial distribution and scanning distance of an ion beam.
Figure 8B:
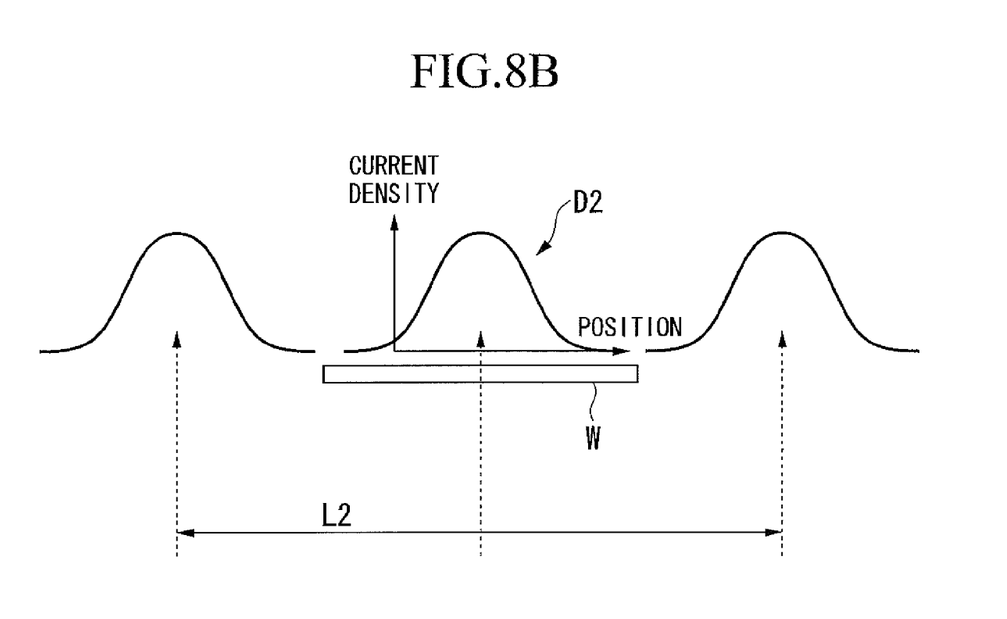
FIG. 8B is an explanatory diagram of the spatial distribution and scanning distance of an ion beam.

FIG. 8A and FIG. 8B are explanatory diagrams of the spatial distribution and scanning distance of an ion beam. An ion beam 2 radiated on a semiconductor substrate W has a current density with a spatial distribution D. In order to perform ion implantation uniformly over the whole region of the substrate W, it is necessary to scan until the spatial distribution D of the ion beam falls outside of the substrate. As shown in FIG. 8A, in the case where the spatial distribution $D_1$ of the ion beam is small, the scanning distance $L_1$ of the ion beam becomes short, and as shown FIG. 8B, while in the case where the spatial distribution $D_2$ of the ion beam is large, the scanning distance $L_2$ of the ion beam becomes long. If the scanning distance is short, the ion implantation time becomes short, and thereby improving the throughput. Therefore, a smaller spatial distribution of the ion beam is preferable.

On the other hand, the greater the current density of the ion beam, the shorter the implantation time becomes. However, the greater the current density, the more the ion beam diverges due to the space charge effect, which increases the spatial distribution. Therefore, it is necessary to compress the spatial distribution by setting the operating conditions of the optical elements, while maintaining the current density of the ion beam by setting the operating conditions of the ion source. Heretofore, compressing the spatial distribution has been achieved by manually changing the operating conditions of an accelerating tube and quadrupole lenses, or the like, while monitoring the spatial distribution in the vicinity of the substrate.

Patent Document 1: Japanese Unexamined Patent Application, First Publication No. S63-91949

Patent Document 2: Japanese Unexamined Patent Application, First Publication No. H05-135729

DISCLOSURE OF INVENTION

Problems that the Invention is to Solve

Compressing the spatial distribution as described above normally takes about five to ten minutes. Compressing the spatial distribution needs to be performed when starting an ion implantation device, and whenever the recipe is changed. In order to shorten the processing time of semiconductor processing, it is desirable for the spatial distribution compression time to be shortened. To be specific, it is desirable for the whole of the starting of an ion implantation device and recipe change to be completed in about one minute.

In order to shorten the adjustment time, Patent Document 1 proposes a method in which optimum operating conditions from recipes used in the past are stored, and optimum operating conditions for a specified recipe are estimated from the stored operating conditions. However, there are a lot of cases in which the estimated operating conditions of an ion source cannot be reproduced in actual operation of the ion source because of considerable change over time due to deterioration of the filament. Therefore, as disclosed in Patent Document 2, stored optimum operating conditions are confined to use as initial values when adjusting the operating conditions using a beam profile monitor, and the actual situation is that it takes a further several minutes or more to obtain the optimum values of the operating conditions.

The present invention has been made in order to solve the above-described problems, with an object of providing an ion implantation device control method, a control system thereof, a control program thereof, and an ion implantation device, which can obtain the optimum values of the operating conditions in a short time without requiring great cost.

Means of Solving the Problems

In order to achieve the above object, an ion implantation device control method of the present invention is a control method of an ion implantation device that radiates an ion beam emitted from an ion source via an optical element onto a material to be treated, including the steps of: measuring a spatial distribution of the ion beam in the vicinity of the material to be treated; estimating an emittance, which is a spatial and angular distribution of the ion beam of the ion source, from the measured spatial distribution, by using an ion beam trajectory calculation method; calculating the operating conditions of the optical element so that the ion beam in the vicinity of the material to be treated has a desired spatial distribution, by using the estimated emittance and the trajectory calculation method; and operating the ion implantation device by using the calculated operating conditions of the optical element.

According to this construction, since the ion beam trajectory calculation method is used, it is possible to obtain the optimum values of the operating conditions of the ion implantation device in a short time. Furthermore, since the construction is such that the emittance is estimated, by using an ion beam spatial distribution measurement device that is normally provided in the ion implantation device, to obtain the optimum values of the operating conditions of the optical element, it is not necessary to newly provide an emittance measurement device or the like in the ion implantation device. Accordingly, it is possible to obtain the optimum values of the operating conditions without requiring great cost.

Since the ion implantation device is operated by using the optimum values of the operating conditions, it is possible to start operating the ion implantation device with the optimum operating conditions in a short time. Hence, the processing time of the semiconductor processing can be shortened.

Moreover, it is desirable that the desired spatial distribution is a spatial distribution in which a width of the ion beam in the vicinity of the material to be treated is substantially at a minimum.

According to this construction, it is possible to shorten the scanning distance of the ion beam. Hence, it is possible to shorten the ion implantation time, and to improve the throughput.

Furthermore, it is desirable that the trajectory calculation method is a calculation method using Kapchinskij and Vladimirskij equations in which the emittance is assumed to be an elliptical surface in a four-dimensional space.

According to this construction, it is possible to obtain the optimum values of the operating conditions in an extremely short time.

Moreover, it is desirable that the trajectory calculation method is a calculation method using multiple elliptical Kapchinskij and Vladimirskij equations in which the emittance is approximated by the superposition of a plurality of elliptical surfaces in a four-dimensional space.

According to this construction, it is possible to obtain the optimum values of the operating conditions with good accuracy in an extremely short time.

On the other hand, an ion implantation device control system of the present invention is a control system of an ion implantation device that radiates an ion beam emitted from an ion source onto a material to be treated via an optical element, including: a measurement device that measures a spatial distribution of the ion beam in the vicinity of the material to be treated; an emittance estimation section that estimates an emittance, which is a spatial and angular distribution of the ion beam of the ion source, from the measured spatial distribution, by using an ion beam trajectory calculation method; an operating condition calculation section that calculates the operating conditions of the optical element so that the ion beam in the vicinity of the material to be treated has a desired spatial distribution, by using the estimated emittance and the trajectory calculation method; and an operation control section that operates the ion implantation device by using the calculated operating conditions of the optical element.

According to this construction, it is possible to obtain the optimum values of the operating conditions of the ion implantation device.

Since the ion implantation device is operated using the optimum values of the operating conditions, it is possible to start operating the ion implantation device with the optimum operating conditions in a short time. Hence, the processing time of the semiconductor processing can be shortened.

Moreover, it is desirable that the desired spatial distribution is a spatial distribution in which a width of the ion beam in the vicinity of the material to be treated is substantially at a minimum.

According to this construction, it is possible to shorten the scanning distance of the ion beam. Hence, it is possible to shorten the ion implantation time and to improve the throughput.

Furthermore, it is desirable that the trajectory calculation method is a calculation method using Kapchinskij and Vladimirskij equations in which the emittance is assumed to be an elliptical surface in a four-dimensional space.

According to this construction, it is possible to obtain the optimum values of the operating conditions in an extremely short time.

Moreover, it is desirable that the trajectory calculation method is a calculation method using multiple elliptical Kapchinskij and Vladimirskij equations in which the emittance is approximated by the superposition of a plurality of elliptical surfaces in a four-dimensional space.

According to this construction, it is possible to obtain the optimum values of the operating conditions with good accuracy in an extremely short time.

On the other hand, a control program for an ion implantation device of the present invention is characterized in that it is used in the above-described control system of the ion implantation device to operate a computer.

According to this construction, it is possible to obtain the optimum values of the operating conditions without requiring great cost.

On the other hand, an ion implantation device of the present invention is characterized in that it contains the above-described control system of the ion implantation device.

According to this construction, it is possible to provide an ion implantation device in which the optimum values of the operating conditions for operation can be obtained in a short time.

EFFECT OF THE INVENTION

According to the present invention, since the trajectory calculation method of an ion beam is used, it is possible to obtain the optimum values of the operating conditions of the ion implantation device in a short time. Furthermore, since the construction is such that an ion beam spatial distribution measurement device that is normally provided in the ion implantation device is used to obtain the optimum values of the operating conditions, no great cost is required.

BRIEF DESCRIPTIONS OF THE REFERENCE SYMBOLS

W Semiconductor Substrate (material to be treated)
1 Ion Implantation Device
12 Ion Source
24, 26 Optical Elements
34 Beam Profile Monitor (Spatial Distribution Measurement Device)
40 Ion Implantation Device Control System
42 Operation Control Section
50 Emittance Estimation Section
60 Operating Condition Calculation Section

BEST MODE FOR CARRYING OUT THE INVENTION

Hereunder is a description of an embodiment of the present invention with reference to the drawings. In each of the drawings used in the following description, in order to make each element a recognizable size, the scale of each of the elements is modified appropriately.

(Ion Implantation Device)

Figure 1:
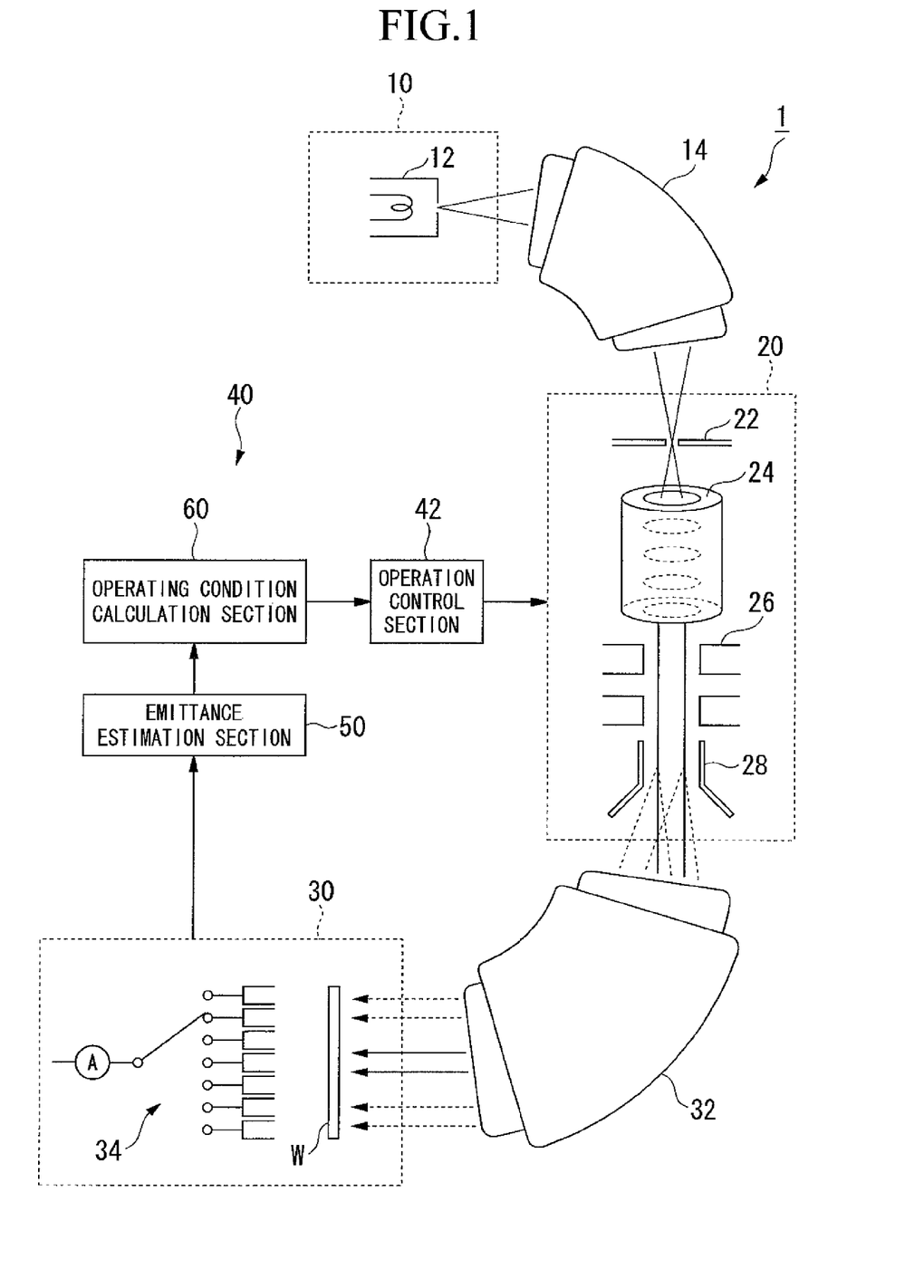
FIG. 1 is a schematic block diagram of an ion implantation device.

FIG. 1 is a schematic block diagram of an ion implantation device. An ion implantation device 1 of the present embodiment contains a beam transport tube constructed such that a mass separator 14, a beam convergence device 20, and a deflecting device 32, are connected in sequence between a high voltage terminal 10 that accommodates an ion source 12, and an end station 30 in which a semiconductor substrate W as a material to be treated is placed and retained. The beam transport tube has functions of mass separating ions emitted from the ion source 12, converging and deflecting the ion beam, and radiating it onto the substrate W.

An ion source 12 is installed in the high voltage terminal 10. For the ion source 12, a hot cathode ion source such as a Bernas type or a Freeman type, or an ECR (electron cyclotron resonance) type ion source, or the like is used. The ions emitted from the ion source 12 are introduced to the mass separator 14.

The mass separator 14 is provided with an electromagnet for mass separating the ions introduced from the ion source 12, and the arrangement is such that only ions of a target mass are extracted, and introduced to the beam conversion device 20 of the following stage.

In the beam convergence device 20, a variable-diameter aperture 22, an accelerating tube 24, quadrupole lenses 26, a scanner 28, and the like are provided in sequence. The variable-diameter aperture 22 narrows the ion beam down to a predetermined diameter for mass separation. The accelerating tube 24 accelerates or decelerates the ion beam to a predetermined energy. The quadrupole lenses 26 converge the ion beam to adjust the shape on the substrate W. The scanner 28 includes a pair of electrodes in parallel to the optical axis so that the ion beam is scanned over the substrate W at a speed of about 1 kHz.

The deflecting device 32 is connected to the last stage of the beam convergence device 20. The deflecting device 32 functions as a collimator lens that makes the ion beam parallel to lead it to the end station 30 side, and at the same time removes ions and neutral particles that have collided with residual gas in the beam path, and whose electrical charges have changed.

In the end station 30, a stage (not shown in the figure) is installed, which supports the substrate W. This stage can be moved in one direction by a drive mechanism.

Furthermore, a beam profile monitor (spatial distribution measurement device) 34 is installed in the vicinity of the substrate W. The beam profile monitor 34 measures the spatial distribution of the current density of the ion beam in the vicinity of the substrate W, and it includes a plurality of Faraday cups placed in a line. It is also possible to place a plurality of ammeters or galvanometers in a line instead of the Faraday cups to form the beam profile monitor 34.

In order to operate an ion implantation device constructed as above, it is necessary to specify a recipe such as the type of ions to be implanted, the implantation energy, the implantation amount, and the like. When the type of ions to be implanted is specified, the operating conditions of the mass separator 14, the variable-diameter aperture 22 and the like, are set. Moreover, when the implantation energy is specified, the operating conditions of the accelerating tube 24 and the like are set. Furthermore, when the implantation amount is specified, the operating conditions of the ion source and the like are set.

When the operating conditions are set and the ion implantation device is operated, an ion beam emitted at an energy of approximately 30 keV from the ion source 12 is separated into a predetermined type of ion by the mass separator 14, and narrowed to a predetermined beam diameter by the variable-diameter aperture 22. Next, the ion beam is accelerated or decelerated to a predetermined energy of approximately 10 to 500 keV by the accelerating tube 24.

Furthermore, the ion beam is adjusted such that it is converged on the substrate W by the quadrupole lenses 26, and scanned all over the substrate W by the scanner 28. Afterwards, the ion beam is made parallel by the deflecting device 32, and radiated onto the substrate W in the end station 30. Normally, by scanning the ion beam in the horizontal direction at approximately 1 kHz, and by scanning the substrate W itself in the vertical direction at approximately 1 Hz, the ion beam is radiated over the whole substrate.

FIG. 8A and FIG. 8B are explanatory diagrams of the spatial distribution and scanning distance of an ion beam. An ion beam 2 radiated on the substrate W has a current density of a spatial distribution D. In order to perform ion implantation uniformly over the whole area of the substrate W, it is necessary to scan until the spatial distribution D of the ion beam falls outside of the substrate. As shown in FIG. 8A, in the case where the spatial distribution $D_1$ of the ion beam is small, the scanning distance $L_1$ of the ion beam becomes short, while as shown in FIG. 8B, in the case where the spatial distribution $D_2$ of the ion beam is large, the scanning distance $L_2$ of the ion beam becomes long. If the scanning distance is short, the ion implantation time becomes short, and thereby improving the throughput. Therefore, a smaller spatial distribution of the ion beam is preferable.

On the other hand, the greater the current density of the ion beam, the shorter the implantation time becomes. However, the greater the current density, the more the ion beam diverges due to the space charge effect, which increases the spatial distribution. Therefore, it is necessary to compress the spatial distribution of the ion beam by setting the operating conditions of the optical elements (accelerating tube, quadrupole lenses, and the like) while maintaining the current density of the ion beam by setting the operating conditions of the ion source. In the same way as light focused by a convex lens forms a focal point, so the spatial distribution of the ion beam converged by the optical elements has a minimum (local minimum) value.

In the present embodiment, by using the ion implantation device control system and the control method thereof described next, the compression operation of the spatial distribution is performed automatically. The ion implantation device control method according to the present embodiment estimates the emittance of an ion beam from the measured value of the spatial distribution of the ion beam by using the trajectory calculation method, and furthermore estimates the optimum values of the operating conditions of the optical elements using the estimated emittance, by using the trajectory calculation method.

(Ion Implantation Device Control System)

As shown in FIG. 1, an ion implantation device control system 40 according to the present embodiment is provided with an ion beam emittance estimation section 50, an optical element operating condition calculation section 60, and an optical element operation control section 42. Here, the emittance of the ion beam denotes the spatial and angular distribution of the current density of the ion beam in the vicinity of the ion source.

Figure 2:
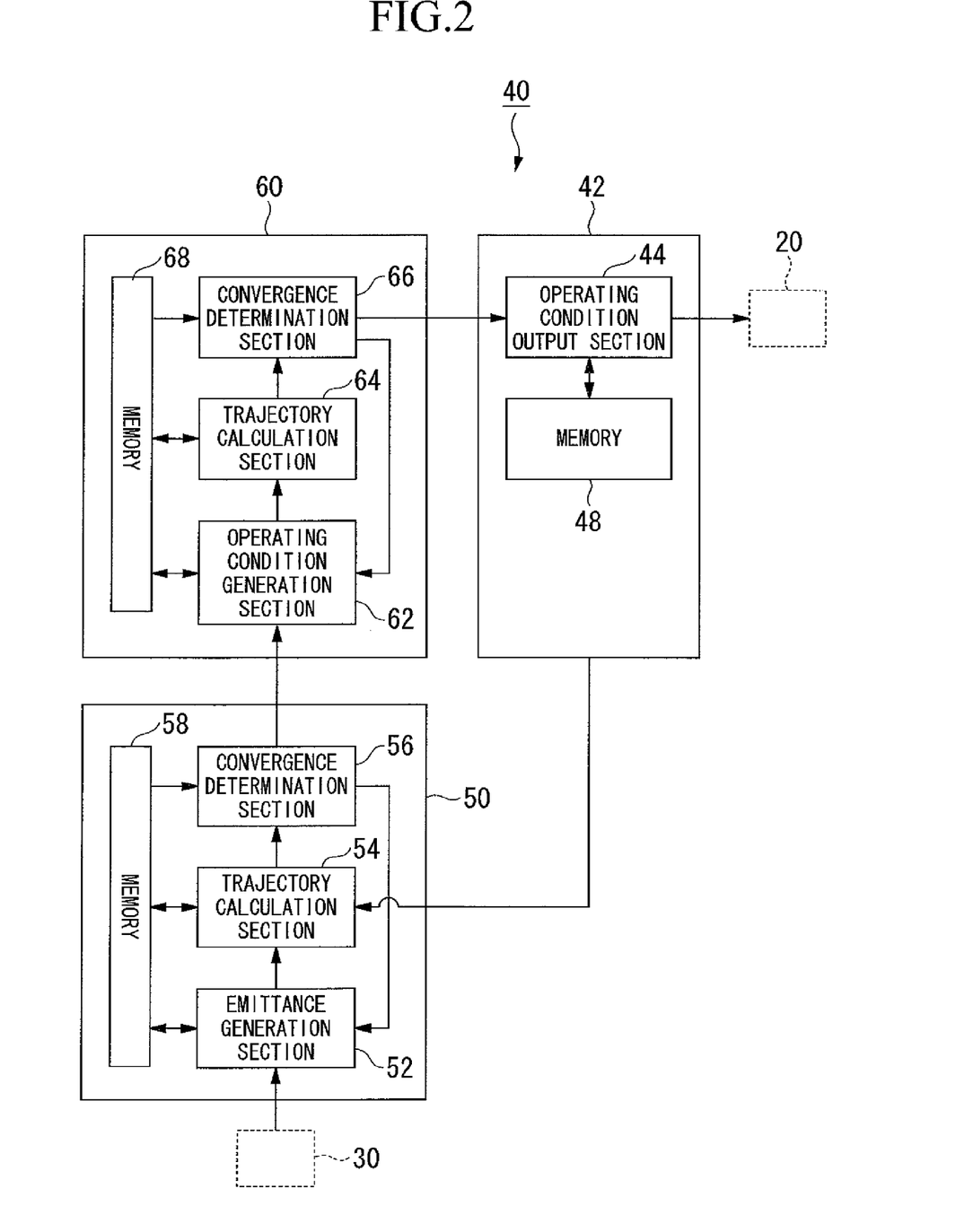
FIG. 2 is a block diagram of an ion implantation device control system according to an embodiment of the present invention.

FIG. 2 is a block diagram of the ion implantation device control system according to the present embodiment. The main parts of the emittance estimation section 50 include an estimated emittance value generation section 52, an ion beam trajectory calculation section 54, a convergence determination section 56, and a memory 58.

The emittance generation section 52 generates an estimated emittance value, which is used for calculating the trajectory of an ion beam. The trajectory calculation section 54 calculates the trajectory of an ion beam based on the estimated emittance value generated and the current operating conditions of the optical elements, and calculates the spatial distribution of the ion beam in the vicinity of the substrate W. The convergence determination section 56 compares the calculated value of the spatial distribution of the ion beam and the actual measured value, and determines the match between the two. The memory 58 stores information of the estimated emittance value, the operating conditions of the optical elements, the calculated value of the spatial distribution of the ion beam, its actual measured value, and the like, which are used in the emittance generation section 52, the trajectory calculation section 54, and the convergence determination section 56.

Furthermore, the main parts of the operating condition calculation section 60 include an optical element operating condition generation section 62, an ion beam trajectory calculation section 64, a convergence determination section 66, and a memory 68.

The optical element operating condition generation section 62 generates the operating conditions of the optical elements, which are used in calculating the trajectory of an ion beam. The trajectory calculation section 64 calculates the trajectory of the ion beam based on the generated operating conditions of the optical elements and the estimated emittance value, and calculates the spatial distribution of the ion beam in the vicinity of the substrate W. The convergence determination section 66 determines the minimum (local minimum) of the calculated value of the spatial distribution of the ion beam. The memory 68 stores information of the operating conditions of the optical elements, the estimated emittance value, the calculated value of the spatial distribution of the ion beam, and the like, which are used in the operating condition generation section 62, the trajectory calculation section 64, and the convergence determination section 66.

Moreover, the main parts of the operation control section 42 include an optical element operating condition output section 44, and a memory 48. The optical element operating condition output section 44 outputs the calculated operating conditions to the optical elements. The memory 48 stores the current operating conditions.

(Ion Implantation Device Control Program)

The above-mentioned ion implantation device control system can be realized via a control program. That is, a computer readable recording medium in which a control program of the ion implantation device is stored, is installed in a reading device of the computer, and the control program is executed by the computer. In this manner, it is possible to operate the computer as an ion implantation device control system.

(Ion Implantation Device Control Method)

Figure 3:
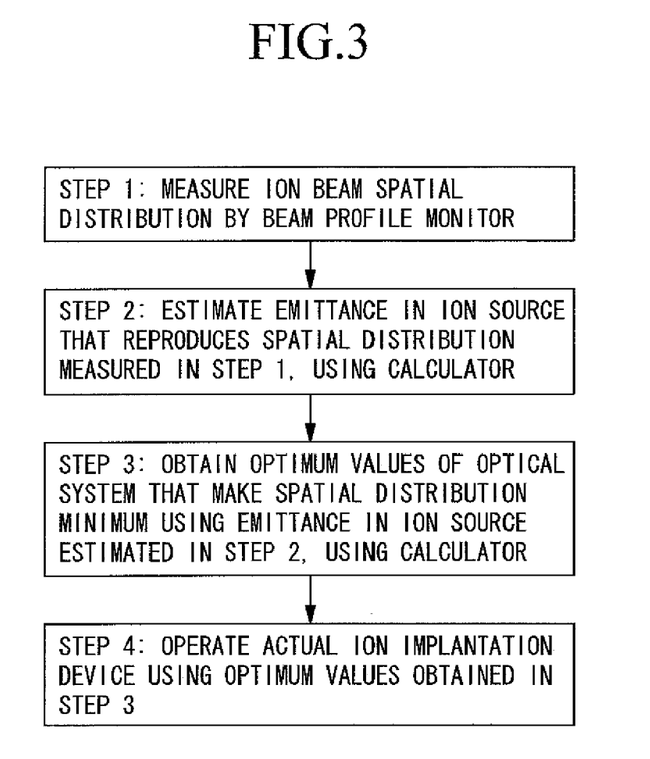
FIG. 3 is a flow chart of an ion implantation device control method according to an embodiment of the present invention.

Next is a description of an ion implantation device control method based on the above-described ion implantation device control system. FIG. 3 is a flow chart of the ion implantation device control method according to the present embodiment.

Firstly, the spatial distribution of an ion beam is measured by the beam profile monitor (step 1).

To be specific, specified recipes are input to the ion source 12, the mass separator 14, the accelerating tube 24, and the like, of the ion implantation device 1 shown in FIG. 1, and initial values of practical operating conditions are input to each of the optical elements, so that the ion implantation device 1 can be operated. Next, by injecting an ion beam directly into the beam profile monitor 34 in the end station 30, an actual measured value of the spatial distribution of the ion beam is obtained.

Next, the emittance of an ion beam that enables the spatial distribution measured in step 1 is estimated (step 2).

This operation is performed in the emittance estimation section 50. To be specific, the actual measured value of the ion beam spatial distribution obtained in step 1 is input to the emittance generation section 52 of the emittance estimation section 50 shown in FIG. 2. The emittance generation section 52 stores the input actual measured value of the spatial distribution, in the memory 58. Furthermore, the emittance generation section 52 reads from the memory 58 an initial value of a practical emittance stored in advance in the memory 58. A plurality of initial values may be stored in the memory 58 in advance, and the most appropriate initial value to realize the actual measured value of the spatial distribution may be selected from the memory 58. In this case, it is possible to shorten the emittance estimation time. The emittance generation section 52 outputs the read initial value of the emittance, to the trajectory calculation section 54.

The trajectory calculation section 54 firstly obtains the operating conditions of each optical element when the spatial distribution of the ion beam is measured from the operation control section 42. To be specific, the operating condition output section 44 of the operation control section 42 reads the current operating conditions from the memory 48, and outputs them to the trajectory calculation section 54 of the emittance estimation section 50. The trajectory calculation section 54 stores the obtained operating conditions in the memory 58.

Then, in the trajectory calculation section 54, ion beam trajectory calculation is performed based on the input initial value of the emittance and operating conditions of the optical elements, and the spatial distribution of the ion beam in the vicinity of the substrate is calculated.

It is desirable to use Kapchinskij and Vladimirskij equations (referred to hereunder as "KV equations") as an ion beam trajectory calculation method. The KV equations are ordinary differential equations for paraxial approximation that, assuming that the emittance (width of beam) at the starting point of charged particles at an ion source or the like, is an elliptical surface in four-dimensional space, describe the envelope of the trajectory of the charged particles in three-dimensions with consideration of the space charge effect.

Figure 4:
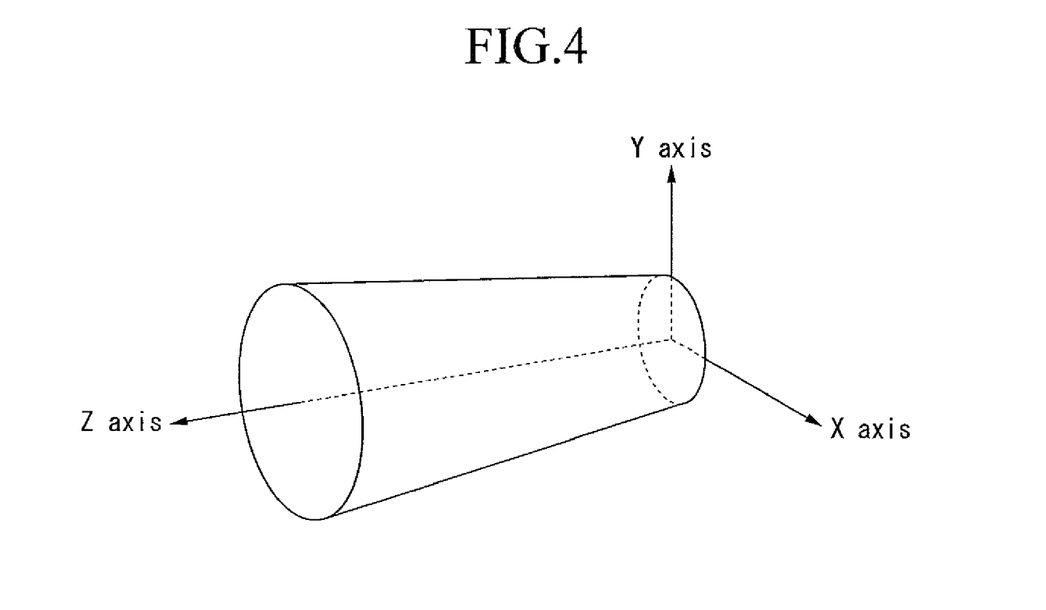
FIG. 4 is an explanatory diagram of the envelope of a charged particle beam on a system of coordinates.

As shown in FIG. 4, the optical axis of the charged particle beam is designated the Z axis, and the two axes perpendicular to it are designated the X axis and Y axis. If it is assumed that the emittance of the charged particle beam is an elliptical surface in four-dimensional space, where the emittances in the X plane and Y plane are $\in_x$ and $\in_y$ respectively, X and Y, being the envelopes of the charged particle beam, are expressed by the following KV equations.

$$\frac{d^2}{dz^2}X + F_x X = \frac{2K}{X+Y} + \frac{\varepsilon_x^2}{X^3}$$
$$\frac{d^2}{dz^2}Y + F_y Y = \frac{2K}{X+Y} + \frac{\varepsilon_y^2}{Y^3}$$

[Equation 1]

Here, $F_x$ and $F_y$ denote the lens functions of the X plane and Y plane respectively, and correspond to the operating conditions of quadrupole lenses. In the case of electrostatic quadrupole lenses, if the electric potential $\phi$ in its vicinity is expressed by a cylindrical coordinate system, it becomes as follows.

$$\phi(r, \theta, z) = r^2 \cos(2\theta) g(r, z) \quad \text{[Equation 2]}$$

If the electrostatic potential of the ion beam is $\Phi_{IB}$, then $F_x$ and $F_y$ of equation 2 are expressed approximately as follows.

$$F_x \approx \frac{g(0, z)}{\Phi_{IB}} x \quad \text{[Equation 3]}$$

$$F_y \approx \frac{g(0, z)}{\Phi_{IB}} y$$

Furthermore, K of equation 1 is a physical value called the perveance, which describes the strength of divergence due to the space charge effect, and is defined by the following equation where the beam current is I, the electrostatic potential is $\phi$, the quantity of the charged particles is m, the electrical charge of the charged particles is e, and the dielectric constant of a vacuum is $\in_0$.

$$K = \frac{I}{4\pi\varepsilon_0 \phi^{3/2}} \sqrt{\frac{m}{2e}} \quad \text{[Equation 4]}$$

The KV equations for the inside of an optical element where the electrostatic potential $\phi$ changes, such as an accelerating tube, are slightly different from the above, and become as follows. This electrostatic potential $\phi$ corresponds to the operating conditions of the accelerating tube.

$$\frac{d^2}{dz^2} X + \frac{d\phi/dz}{2\phi} \frac{d}{dz} X + \frac{d^2\phi/dz^2}{4\phi} X = \frac{2K}{X+Y} + \frac{\varepsilon_x^2}{X^3} \quad \text{[Equation 5]}$$

$$\frac{d^2}{dz^2} Y + \frac{d\phi/dz}{2\phi} \frac{d}{dz} Y + \frac{d^2\phi/dz^2}{4\phi} Y = \frac{2K}{X+Y} + \frac{\varepsilon_y^2}{Y^3}$$

On the other hand, if multiple elliptical KV equations developed by the present inventor are used as a trajectory calculation method of an ion beam instead of the above-described KV equations, it is possible to express the envelope of the trajectory of the charged particles with good accuracy. In the above-described KV equations, the emittance of the charged particles is assumed to be an elliptical surface in a four-dimensional space. However, in the multiple elliptical KV equations, the emittance of the charged particles is approximated by the superposition of a plurality of elliptical surfaces in a four-dimensional space. In this case, X and Y, being the envelopes of the charged particle beam, are expressed as follows by substituting the first terms on the right side of equation 1 with the electric fields in the X direction and Y direction of each of the envelopes of the ellipse, being $E_x(X)$ and $E_y(Y)$.

$$\frac{d^2}{dz^2} X + F_x X = \frac{E_x(X)}{2\phi} + \frac{\varepsilon_x^2}{X^3} \quad \text{[Equation 6]}$$

$$\frac{d^2}{dz^2} Y + F_y Y = \frac{E_y(Y)}{2\phi} + \frac{\varepsilon_y^2}{Y^3}$$

Regarding methods of obtaining $E_x(X)$ and $E_y(Y)$, since the calculation methods for the X direction and the Y direction are the same, only a method of obtaining $E_x(X)$ will be described.

Figure 5A:
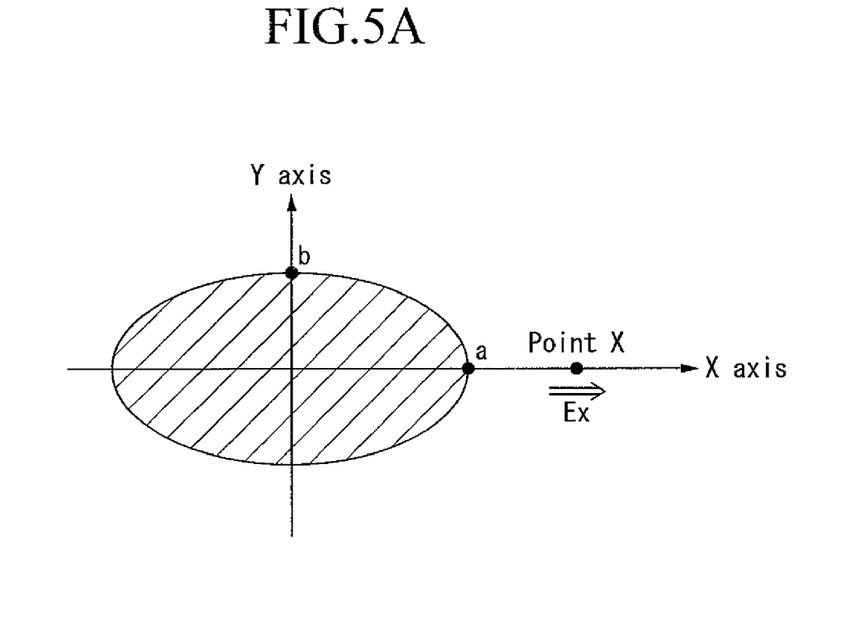
FIG. 5A is an explanatory diagram of a method of calculating the electric field at a point X.

As shown in FIG. 5A, the electric field $E_x(X)$ at a point X outside of the charged particles distributed uniformly in an ellipse is expressed as follows, where the density of the charged particles is n, the width of the ellipse in the X direction is a, and the height of the ellipse in the Y direction is b.

$$E_x(X) = \frac{neab}{\pi\varepsilon_0} \frac{2}{\sqrt{X^2 - a^2 + b^2}} \int_{-1}^{1} \frac{(1+t^2)^2}{(1+t^2)(1+\alpha t^2 + t^4)} dt \quad \text{[Equation 7]}$$

$$\alpha = 2 \frac{X^2 - (b^2 - a^2)}{X^2 + (b^2 - a^2)}$$

Figure 5B:
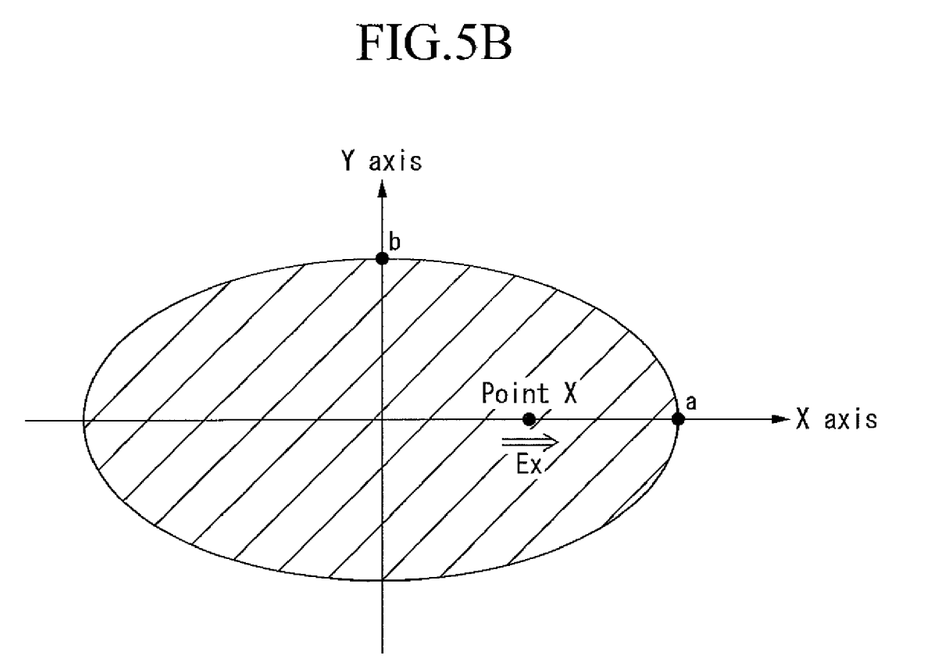
FIG. 5B is an explanatory diagram of a method of calculating the electric field at a point X.

On the other hand, as shown in FIG. 5B, the electric field $E_x(X)$ at a point X inside of the charged particles distributed uniformly in an ellipse is expressed as follows.

$$E_x(X) = \frac{ne}{\varepsilon_0} \frac{bX}{a+b} \quad \text{[Equation 8]}$$

Figure 6:
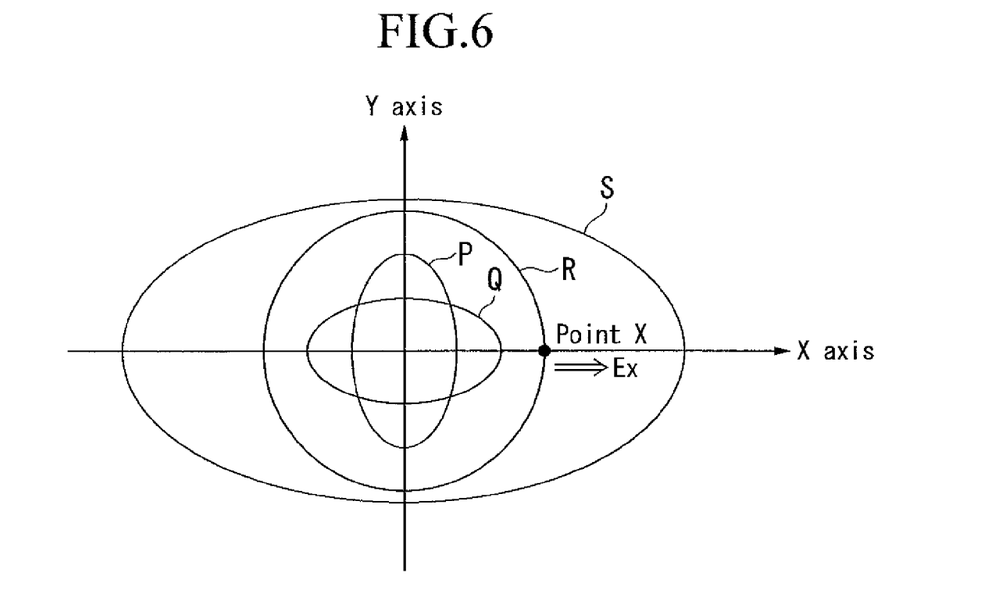
FIG. 6 is an explanatory diagram of a method of calculating the electric field using multiple elliptical KV equations.

As shown in FIG. 6, in the case where the emittance of the charged particles is approximated by the superposition of a plurality of elliptical surfaces in a four-dimensional space, the electric field $E_x(X)$ of the ellipses P and Q, which the point X is outside of, is calculated by using equation 7, and the electric fields $E_x(X)$ of the ellipse S, which the point X is inside of, and the ellipse R, which envelopes the point X, are calculated by using equation 8. By adding them, it is possible to obtain the electric field $E_x(X)$ at the point X. Here, regarding the integral contained in equation 7, the form of the function is comparatively easy, so numerical integration is easy. In this manner, if the emittance is approximated by the superposition of the elliptical surfaces in a four-dimensional space, the envelope of each ellipse can be calculated easily. Therefore, even in the case where the distribution of charged particles is not uniform, it is possible to calculate the distribution of the charged particles along the optical axis quickly.

Returning to FIG. 2, the trajectory calculation section 54 of the emittance estimation section 50 calculates the trajectory of an ion beam by using the trajectory calculation method, and calculates the spatial distribution in the vicinity of the substrate. Then, it stores the calculated spatial distribution in the memory 58, and also outputs it to the convergence determination section 56.

Next, the convergence determination section 56 determines the match between the calculated value of the spatial distribution of the ion beam and the actual measured value. To be specific, firstly, it reads out the actual measured value of the spatial distribution stored in the memory 58, and compares it with the input calculated value. Then, in the case where the difference between the two exceeds a predetermined value, it determines that the two do not match, and outputs the difference between the two to the emittance generation section 52.

In the emittance generation section 52, with reference to the input information, a new estimated emittance value to use for the next trajectory calculation is generated so that the calculated value of the spatial distribution and the actual measured value match. In the case where KV equations are used as a trajectory calculation method, the new emittance is a modified ellipse, and in the case where the multiple elliptical surface KV equations are used, the new emittance is a weighted modification of a plurality of ellipses. A method of unconstrained non-linear optimization may be used to generate the estimated value. For a method of unconstrained nonlinear optimization, a steepest descent method, the Newton method, a conjugate direction method, a quasi-Newton method or the like can be used for example. The newly generated estimated emittance value is stored in the memory 58, and also output to the trajectory calculation section 54. In this manner, while changing the emittance as a parameter, calculations are performed repeatedly until the calculated value of the spatial distribution of the ion beam matches the actual measured value.

On the other hand, in the convergence determination section 56, in the case where the difference between the calculated value of the spatial distribution and the actual measured value is smaller than a predetermined value, it is determined that the two match. In this case, it is possible to estimate that the emittance that is used for the last trajectory calculation matches the current emittance. Then, the convergence determination section 56 reads from the memory 58 the estimated emittance used for the last trajectory calculation, the operating conditions of the optical elements, and the calculated value of the spatial distribution obtained by the last trajectory calculation, and outputs them to the operating condition calculation section 60.

Next, by using the emittance at the ion source, estimated in step 2, the operating conditions of the optical elements that minimize the spatial distribution of the ion beam are obtained (step 3).

The estimated emittance value and the operating conditions of the optical elements, output to the operating condition calculation section 60, are input to the operating condition generation section 62. The operating condition generation section 62 stores in the memory 68 the input estimated emittance value, the operating conditions of the optical elements, and the calculated value of the spatial distribution. Furthermore, the operating condition generation section 62 generates new operating conditions to use for the next trajectory calculation with reference to the input information such that the spatial distribution of the ion beam is minimized. Then, the operating condition generation section 62 outputs the generated operating conditions to the trajectory calculation section 64.

Next, the trajectory calculation section 64 reads the estimated emittance value from the memory 68. Then, based on the estimated emittance value and the input operating conditions of the optical elements, the trajectory of the ion beam and the spatial distribution of the ion beam in the vicinity of the substrate are calculated. It is possible to use the above-described KV equations, multiple elliptical surface KV equations, or the like, as the trajectory calculation method of the ion beam. Moreover, the trajectory calculation section 64 stores the spatial distribution calculated in the memory 68, and also outputs it to the convergence determination section 66.

Next, the convergence determination section 66 determines the minimum (local minimum) of the calculated spatial distribution. To be specific, firstly, the spatial distribution calculated in the previous trajectory calculation is read from the memory 68, and then it is compared with the spatial distribution calculated by the current trajectory calculation. In the case where the difference between the two exceeds a predetermined value, it is determined that the spatial distribution calculated this time is not at the minimum. As long as the calculated spatial distribution continues to decrease, it is also possible to determine that it is not at the minimum. The convergence determination section 66 outputs the difference in spatial distribution between the previous time and the current time, to the operating condition generation section 62.

In the operating condition generation section 62, new operating conditions of the optical elements to use for the next trajectory calculation are generated with reference to the input information such that the calculated value of the spatial distribution of the ion beam is minimized. Since actual quadrupole lenses or the like have restrictions, such as applied voltage and the like, a method of constrained non-linear optimization may be used to generate operating conditions. For a method of constrained non-linear optimization, a gradient projection method, a generalized reduced gradient method, a penalty function method, a multiplier method, or the like, can be used for example. The newly generated operating conditions are stored in the memory 68, and also output to the trajectory calculation section 64. In this manner, the operating conditions are changed as parameters, and calculations are performed repeatedly until the spatial distribution of the ion beam reaches the minimum.

On the other hand, in the convergence determination section 66, in the case where the difference in spatial distribution between the previous time and this time is lower than the predetermined value, it is determined that the spatial distribution calculated this time is at the minimum. In these cases, the operating conditions of the optical elements that minimize the spatial distribution in the trajectory calculation also can be estimated to be the operating conditions that minimize the spatial distribution in the actual ion implantation device. Therefore, the convergence determination section 66 outputs the operating conditions of the optical elements that minimize the spatial distribution, to the operation control section 42.

Next, the actual ion implantation device is operated by using the optimum values of the operating conditions of the optical elements obtained in step 3 (step 4).

The operating conditions of the optical elements output to the operation control section 42 are input to the operating condition output section 44 as shown in FIG. 2. The operating condition output section 44 stores the input operating conditions in the memory 48, and also outputs them to the accelerating tube 24, the quadrupole lenses 26, and the like. In this manner, the ion implantation device 1 is operated at the optimum conditions in which the spatial distribution of the ion beam becomes a minimum while realizing the specified recipe.

Figure 7:
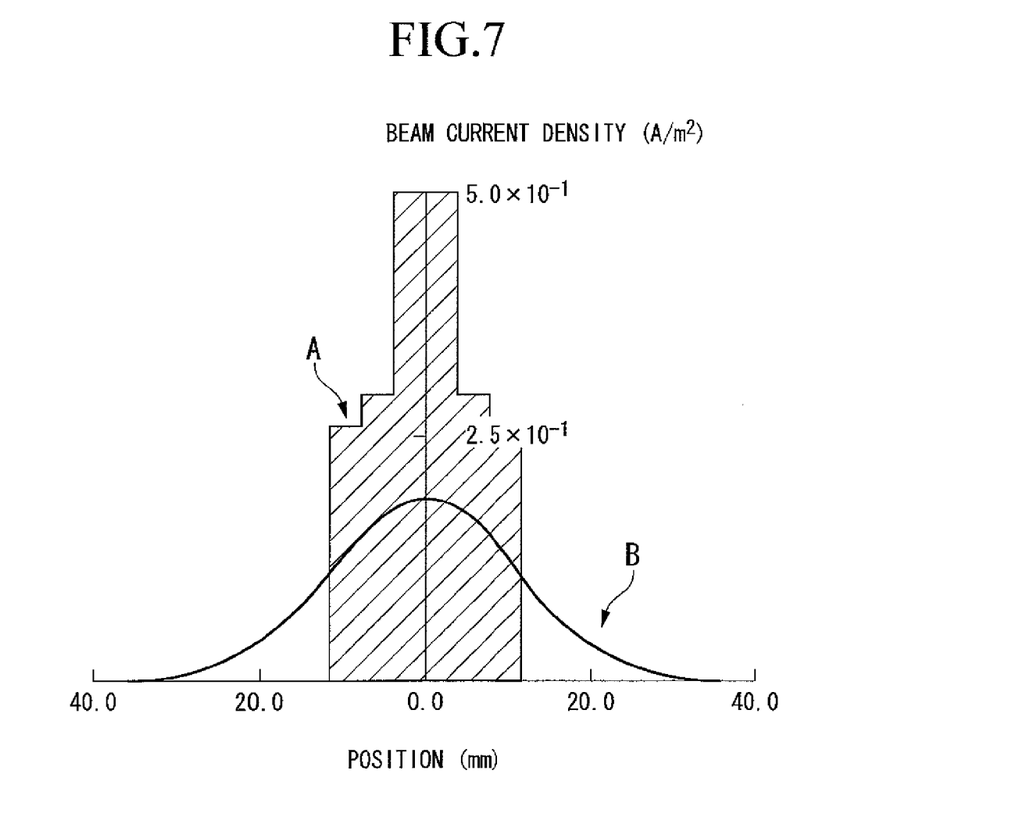
FIG. 7 is a graph of the spatial distribution of an ion beam before and after a control method is performed.

FIG. 7 is a graph of the spatial distribution of an ion beam before and after the control method according to the present embodiment is performed. The horizontal axis is the position of the substrate in the radial direction, and the vertical axis is the beam current density. Graph B of FIG. 7 shows actual measured values of the spatial distribution of the ion beam before the control method is performed.

Graph A of FIG. 7 shows calculated values of the spatial distribution of the ion beam optimized by performing the control method. Here, since the multiple elliptical KV equations are used as the trajectory calculation method, and the beam current density is calculated by adding a plurality of ellipses, graph A is a bar chart.

In contrast to graph B, in graph A, the width of the spatial distribution of the ion beam is small, and the current density is large. This is a similar phenomenon to that where an incident light is focused by a convex lens, and a focal point is formed. As a result, it is confirmed that by performing the above-mentioned control method to calculate the operating conditions of the optical elements, the spatial distribution of the ion beam can be optimized.

In a conventional ion implantation device, at the time of starting the device or changing the recipe, it has required approximately five to ten minutes to obtain the optimum values for the optical elements such as an ion source, quadrupole lenses, and the like.

Furthermore, even using a control system in which the past optimum values are stored for use, several minutes of adjusting time are required as the operating conditions of the ion source change over time. Moreover, at the time of the adjustment, since it is necessary to actually apply a high voltage to the quadrupole lenses, there are problems in that discharge may occur, and that the ion beam irradiates the inner wall of the chamber.

In contrast, the ion implantation device control method according to the above-mentioned present embodiment is constructed such that the emittance of the ion beam is estimated from a measured value of the spatial distribution of the ion beam by using a trajectory calculation method, and furthermore the optimum values of the operating conditions of the optical elements are estimated by using the estimated emittance and the trajectory calculation method.

According to the construction, since the ion beam trajectory calculation method is used, it is possible to obtain the optimum values of the operating conditions of the ion implantation device in a short time. To offer an example, at the time of starting the ion implantation device, or changing the recipe, regardless of the change over time of the ion source, it is possible to obtain the optimum values for optical elements such as quadrupole lenses in a short time of one to three minutes. In the process of obtaining the optimum values of the operating conditions, it is evidently possible to avoid the ion beam irradiating the inner wall of the chamber, and discharge, or the like. Moreover, since the construction is such that the emittance is estimated, by using a beam profile monitor that is normally provided in the ion implantation device, to obtain the optimum values of the operating conditions of the optical elements, it is not necessary to newly provide an emittance monitor or the like in the ion implantation device. Accordingly, it is possible to obtain the optimum values of the operating conditions without requiring great cost.

Furthermore, by using the KV equations wherein the emittance is assumed to be an elliptical surface in a four-dimensional space, as the ion beam trajectory calculation method, it is possible to obtain the optimum values of the operating conditions of the ion implantation device in an extremely short time. Moreover, by using multiple elliptical KV equations wherein the emittance is approximated by the superposition of elliptical surfaces in four-dimensional space, as a trajectory calculation method of the ion beam, it is possible to obtain the optimum values of the operating conditions of the ion implantation device with good accuracy in a short time.

Moreover, it is possible to minimize the spatial distribution of the ion beam by operating the ion implantation device using the optimum values of the calculated operating conditions. As a result, it is possible to shorten the scanning distance of the ion beam. Hence, it is possible to shorten the ion implantation time, and to improve the throughput. Furthermore, it is possible to increase the current density of the ion beam by operating the ion implantation device using the calculated optimum values of the operating conditions. As a result, the ion implantation time is further shortened, and hence the throughput can be improved significantly.

The technical range of the present invention is not limited to the above-mentioned embodiment. It includes the addition of a range of modifications to the embodiment within the scope of the gist of the invention. That is, the specific materials, structure, manufacturing conditions, and the like, which are given in the embodiment, are only examples, and appropriate modifications are possible.

INDUSTRIAL APPLICABILITY

The present invention can be used suitably in ion implantation processing for a semiconductor substrate, which is essential in semiconductor processing.

What is claimed is:

1. A control method of an ion implantation device that radiates an ion beam emitted from an ion source via an optical element onto a material to be treated, comprising the steps of:
   measuring a spatial distribution of the ion beam in the vicinity of the material to be treated;
   estimating an emittance, which is a spatial and angular distribution of the ion beam of the ion source, from the measured spatial distribution, by using an ion beam trajectory calculation method;
   calculating operating conditions of the optical element so that the ion beam in the vicinity of the material to be treated has a desired spatial distribution, by using the estimated emittance and the trajectory calculation method; and
   operating the ion implantation device by using the calculated operating conditions of the optical element
   wherein
   the trajectory calculation method is a calculation method using Kapchinskij and Vladimirskij equations in which the emittance is assumed to be an elliptical surface in a four-dimensional space.

2. A control method of an ion implantation device that radiates an ion beam emitted from an ion source via an optical element onto a material to be treated, comprising the steps of:
   measuring a spatial distribution of the ion beam in the vicinity of the material to be treated;
   estimating an emittance, which is a spatial and angular distribution of the ion beam of the ion source, from the measured spatial distribution, by using an ion beam trajectory calculation method;
   calculating operating conditions of the optical element so that the ion beam in the vicinity of the material to be treated has a desired spatial distribution, by using the estimated emittance and the trajectory calculation method; and
   operating the ion implantation device by using the calculated operating conditions of the optical element
   wherein
   the trajectory calculation method is a calculation method using multiple elliptical Kapchinskij and Vladimirskij equations in which the emittance is approximated by the superposition of a plurality of elliptical surfaces in a four-dimensional space.

3. The control method of an ion implantation device according to claim 1, wherein the desired spatial distribution is a spatial distribution in which a width of the ion beam in the vicinity of the material to be treated is at a minimum.

4. The control method of an ion implantation device according to claim 2, wherein the desired spatial distribution is a spatial distribution in which a width of the ion beam in the vicinity of the material to be treated is at a minimum.

* * * * *